US011227078B2

(12) United States Patent
Rakuff et al.

(10) Patent No.: US 11,227,078 B2
(45) Date of Patent: Jan. 18, 2022

(54) METHOD AND SYSTEM FOR AUTOMATED GEAR REDUCER DESIGN

(71) Applicant: Dodge Acquisition Co., Oxford, CT (US)

(72) Inventors: Stefan Rakuff, Windsor, CT (US); Jinmiao Huang, Chongqing (CN)

(73) Assignee: Dodge Acquisition Co., Oxford, CT (US)

( * ) Notice: Subject to any disclaimer, the term of this patent is extended or adjusted under 35 U.S.C. 154(b) by 237 days.

(21) Appl. No.: 16/281,859

(22) Filed: Feb. 21, 2019

(65) Prior Publication Data
US 2020/0272705 A1    Aug. 27, 2020

(51) Int. Cl.
*G06F 17/10* (2006.01)
*G06F 30/17* (2020.01)
*G06N 20/00* (2019.01)

(52) U.S. Cl.
CPC ............. *G06F 30/17* (2020.01); *G06N 20/00* (2019.01)

(58) Field of Classification Search
CPC .................................................. G06F 17/5022
USPC ...................................................... 703/13, 22
See application file for complete search history.

(56) References Cited

U.S. PATENT DOCUMENTS

2020/0074241 A1* 3/2020 Mahmood .......... G06K 9/00993
2020/0167437 A1* 5/2020 Mallya Kasaragod ..................... G06F 30/27

OTHER PUBLICATIONS

Mohammad Athar Hayat, "Adaptive Gearbox Selection Method to Improve the Performance of Industrial Robotic Arms", Apr. 19, 2017, De Gruyter, pp. 1-17. (Year: 2017).*
Lelai Zhou, "Design optimization on the drive train of a lightweight robotic arm", 2011, Elsevier Ltd, pp. 560-569. (Year: 2011).*

* cited by examiner

*Primary Examiner* — Andy Ho
(74) *Attorney, Agent, or Firm* — Murtha Cullina LLP

(57) ABSTRACT

A method for automated gearbox design includes: instantiating the gearbox model having an initial parameter state in a modeling environment; analyzing and/or characterizing the gearbox model in the modeling environment to determine gearbox model performance; and determining whether the gearbox model performance satisfies a performance target. Upon a determination that the gearbox model performance does not satisfy the performance target: a reward is calculated based on the gearbox model performance; a reinforcement machine learning agent determines a parameter change action based on the reward and a current parameter state of the gearbox model; and an updated parameter state of the gearbox model is determined based on the parameter change action.

19 Claims, 4 Drawing Sheets

METHOD AND SYSTEM FOR AUTOMATED GEAR REDUCER DESIGN

FIELD

The present invention relates to a method and system for automated gear reducer design.

BACKGROUND

A gear reducer is a mechanical device (i.e., a gearbox) that reduces the rotational speed and increases the torque generated by an input power source. Gear reducers are generally used to reduce an input speed to match a desired speed of a down-stream device and/or to provide a higher torque to get more usable work from an input power source. In its simplest form, a gear reducer achieves its intended effect by having an input gear drive an output gear that has more teeth than the input gear, causing the output gear to rotate more slowly.

There are a variety of types of gear reducers, including single-speed, industrial gear reducers, off-set reducers, in-line reducers, worm gear reducer, and planetary gear reducers, among others. In most applications, the gear reducer will be between a prime mover (e.g., an electric motor) and the driven equipment (e.g., the conveyor, feeder, mill, etc.). Gear reducers are used in a variety of industries, including the food processing, mining, and agricultural industries, and come in a broad range of mechanical power ratings (e.g., from less than 0.25 horsepower to more than 2000 horsepower).

The appropriate gear reducer for a particular application may be supplied by selecting an existing gear reducer product that best meets that application's requirements, or by slightly modifying an existing gear reducer to better satisfy such requirements. When no existing gear reducer product exists that can satisfy the application's requirements, a new gear reducer may need to be designed. Indeed, a manufacturer may be tasked with submitting a bid for a new gear reducer design, but a reasonably accurate bid can only be submitted when a final conceptual design of the gear reducer is known.

For the design of a new gear reducer (or product line of gear reducers), a design team is typically tasked with determining the kinematic layout (i.e., arrangement of gears, shafts, bearings, etc.) and sizing of a gear reducer given a set of engineering requirements. The engineering requirements may include torque and power ratings, thermal ratings, and operational speeds, among others. In many cases, there are conflicts among the engineering requirements, and the exact operating conditions of the gear reducer in the field are unknown.

As part of the design process, the design team usually evaluates different kinematic concepts in order to identify the most likely candidate design to meet the engineering requirements. The design candidates may also be ranked in terms of performance versus costs. The goal of the design process is to ensure that a final design concept is reached that best meets the many (often conflicting) engineering requirements, while also being competitive in terms of cost and manufacturability (e.g., requires consideration of part count, part geometries, material usage, machining processes, and assembly and inspection operations).

This design process can be very time consuming, particularly when done using manual steps (as is typical). A significant driver of this time investment is that the design process requires sizing and analysis of individual components within each of the candidate designs. The significant time requirement is also often at odds with a short timeline to generate the conceptual design and submit a bit, which can lead to rushed, sub-par design concepts. Additionally, because the process relies heavily on the experience and skill of the particular designers involved, the design process is susceptible to human error and bias, which may result in a sub-optimal final concept of the gear reducer.

SUMMARY

An embodiment of the present invention provides a method for automated gearbox design that includes: instantiating the gearbox model having an initial parameter state in a modeling environment; analyzing and/or characterizing the gearbox model in the modeling environment to determine gearbox model performance; and determining whether the gearbox model performance satisfies a performance target. Upon a determination that the gearbox model performance does not satisfy the performance target: a reward is calculated based on the gearbox model performance; a reinforcement machine learning agent determines a parameter change action based on the reward and a current parameter state of the gearbox model; and an updated parameter state of the gearbox model is determined based on the parameter change action.

The method of an embodiment may further include iteratively performing the following operations until the gearbox model performance satisfies the performance target: analyzing and/or characterizing the gearbox model having the updated parameter state in the modeling environment to determine the gearbox model performance; calculating a new reward based on the gearbox model performance; determining, by the reinforcement machine learning agent, a new parameter change action based on the new reward and the updated parameter state of the gearbox model; and determining a new updated parameter state of the gearbox model based on the new parameter change action.

In an embodiment, upon a determination that the gearbox model performance satisfies the performance target, the method further includes outputting the current parameter state of the gearbox model as a final gearbox design.

In an embodiment, the gearbox is a gear reducer. The initial parameter state can correspond to an initial gearbox design provided by a user. Also, the performance target can be based on engineering requirements provided by a user.

In an embodiment, the parameter change action includes at least one of enlargements, reductions, material substitutions, or changes to shafts, bearings, or gears, and the kinematic layout of the machine.

The reinforcement machine learning agent, according to an embodiment, determines the parameter change action based upon a value of the reward. The reinforcement machine learning agent can determine the parameter change action based on a randomization algorithm.

In an embodiment, the initial parameter state defines at least one of a dimension of a gearbox component, a material property, a surface hardness, a tolerance class, a type of gearbox, or a number of shafts, gears or bearings.

In an embodiment, the reward is calculated based upon a design criteria corresponding to at least one of a power density, a torque density, a manufacturing cost, or operating efficiency.

In an embodiment, the model environment comprises at least one of a machine element analysis program, a finite element model of a housing, or a cost model.

In an embodiment, the reinforcement machine learning agent is configured to maximize a cumulative reward or to maximize a current reward.

Another embodiment of the present invention provides a system for automated gearbox design. The system includes a model environment configured to analyze and/or characterize a gearbox model to determine gearbox model performance, the gearbox model having a parameter state; and a reinforcement machine learning agent configured to determine a parameter change action based on a reward and the parameter state of the gearbox model. The reward is based upon the gearbox model performance. The parameter state of the gearbox model is updateable based on the parameter change action.

The model environment can be further configured to update the parameter state of the gearbox model according to the parameter change action. The reinforcement machine learning agent also can be further configured to iteratively determine a new parameter change action based on a current parameter state of the gearbox and a current reward based on a current gearbox model performance until the current gearbox model performance satisfies a performance target.

In an embodiment, the performance target is based on engineering requirements provided by a user.

In an embodiment, the model environment is configured to set an initial parameter state of the gearbox model based on an input received from a user.

In an embodiment, the model environment includes at least one of a machine element analysis model, a finite element model of a housing, or a cost model.

In an embodiment, a reinforcement machine learning agent includes an action library defining available actions used to determine the parameter change action as at least one of enlargements, reductions, material substitutions, or changes to shafts, bearings, or gears and the kinematic layout used.

In an embodiment, the reinforcement machine learning agent is configured to determine the parameter change action based further on a randomization algorithm.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
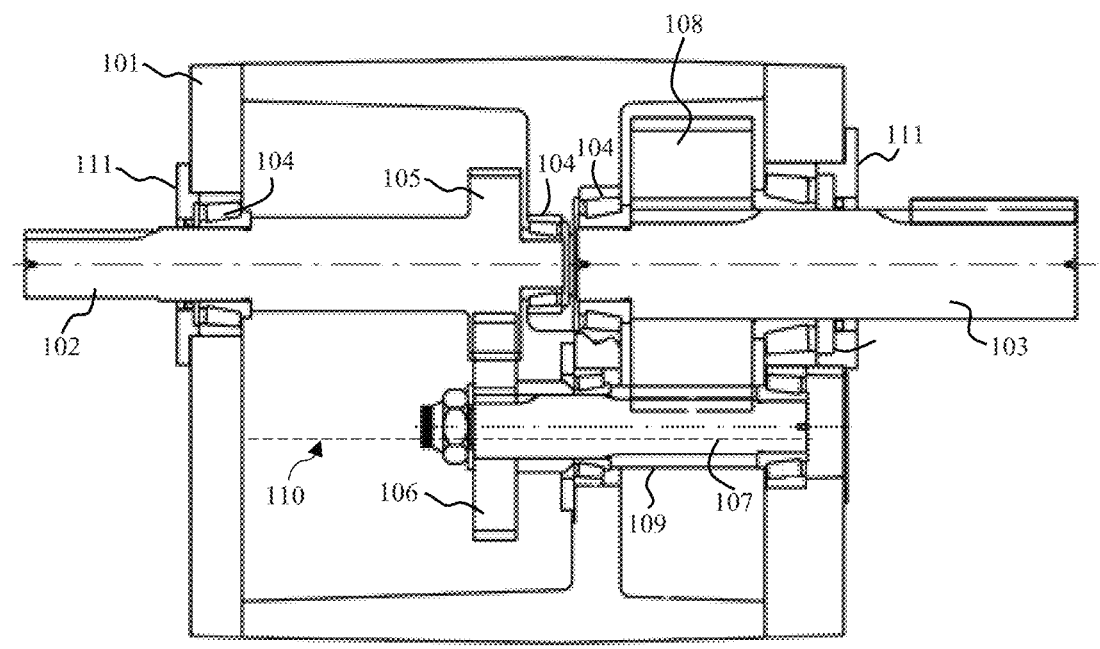
FIG. 1 illustrates an embodiment of a gear reducer.

Embodiments of the present invention provide a method and system for automated layout selection and sizing of a gearbox using machine learning, for example using reinforcement learning. While the present invention is described primarily in connection with a gear reducer, as would be recognized by a person of ordinary skill in the art, the invention is not so limited and inventive features apply to other types of gearboxes (e.g., speed increaser, differential, etc.)

According to aspects of the present invention, an iterative process is used to automate the design of the kinematic layout and sizing of industrial gear reducers (e.g., the arrangement and sizing of gears, shafts, bearings, as well as other components in the gear reducer). In an exemplary embodiment, a reinforcement learning algorithm is employed to automate the process of making decisions and trading-off conflicting engineering requirements during the initial/conceptual design phase to converge to a final design of the gear reducer.

As such, the present invention enables a highly automated mechanism to design the best-fit gear reducer for a particular application. Not only does this novel mechanism provide practical benefits to gear reducer designers and manufacturers—such as, enabling labor—and cost-effective quoting or biding for a custom gear reducer, but it also provides technical improvements over state-of-the-art computer-assisted gear reducer design. For example, embodiments of the present invention enable the automation of the down-selection process by using reinforcement machine learning. This approach differs significantly from that of traditional gear reducer design and analysis programs (e.g., KISSsys®), which typically require significant interactions with the human-designers (e.g., requiring the human-designer to determine and input particular kinematic layout and sizing changes for iterative analysis). Such human-computer interactions are reduced or eliminated by embodiments of the present invention, which reduces the occurrence of human error and selection bias or unawareness in the design process.

Reinforcement machine learning is a category of machine learning that refers to goal-oriented algorithms, which learn how to attain the goal (or maximize an objective function) through iterative steps. Such "learning" is facilitated by providing positive reinforcement for actions that move toward the goal and/or providing negative reinforcement for actions which move away from the goal.

Reinforcement machine learning algorithms generally include the concepts of agents, environments, states, actions and rewards. A particular reinforcement machine learning algorithm will define how an agent takes actions in an environment (through a plurality of states) so as to maximize a cumulative reward.

Conceptually, the agent is the software analog of a human designer. As such, the agent can take the same (or similar) actions that a designer could make. The reinforcement machine learning algorithm will thus define the set of all possible actions an agent can make.

The environment is the simulation model with which the agent is interacting (e.g., as in the case of the present invention, the environment includes a simulation model of a gearbox). Generally, in reinforcement machine leaning, these interactions are in discrete steps. That is, at a time interval, the agent will take an action on the current state of the environment to create a new state. In this way, the reinforcement machine learning algorithm defines the simulation model for the environment iteratively updating and then analyzing the model in the environment.

A reward is the feedback by which the reinforcement machine learning algorithm measures the success or failure of an agent's actions. After each action taken in the environment is simulated, the agent receives observation information, which includes the reward calculation. The agent then chooses a new action from its set of available actions, which is performed on the current state of the environment. As described above, the environment then changes to a new state and a new reward associated with that transition is determined. This process is then repeated. The goal of a reinforcement learning agent is to collect as much reward as possible. Such a maximization of the reward may be considered over the long-term versus immediate reward maximization. That is, the reinforcement machine learning algorithm can take actions that result in short-term negative rewards but results in a long-term higher reward versus taking only iterative actions which result in the highest immediate reward.

FIG. 1 illustrates an example gear reducer 100. The gear reducer 100 is a concentric gear reducer. Embodiments of the present invention are not limited to the design of such gear reducers, but can be applied to a variety of types and configurations of gear reducers (and other types of gearboxes).

The gear reducer has a housing 101 enclosing the kinematic components (e.g., shafts, gears, bearings, etc.) of the gear reducer 100.

The gear reducer 100 includes and input shaft 102 and an output shaft 103. These shafts (102, 103) are partially protruding out of the housing 101 so that they can be operatively coupled to other devices in operation.

In operation, the input shaft 102 may be operatively coupled to a prime mover (e.g., an electric motor) and the output shaft may be operatively coupled to driven equipment (e.g., the conveyor, feeder, mill, etc.). The gear reducer 100 is configured to reduce the rotational speed at the input shaft 102 to output a lower speed at the output shaft 200 and to increase the torque applied to the input shaft 102 to output a higher torque at the output shaft 103.

The input shaft 102 and the output shaft 103 each have particular sizing characteristics (e.g., length, minimum diameter, maximum diameter) and material properties (e.g., strength, maximum/minimum operational temperatures, elasticity, strain ratings, etc.).

The gear reducer 100 includes a plurality of bearings 104. The bearings 104 are between the shafts (102, 103) and the housing 101 and both translationally affix the shafts (103, 103) in within the housing 101 and allow the shafts to rotate. The bearings will each have particular properties, including temperature, load and speed ratings.

A first gear 105 is attached to the input shaft 102, and rotates at the same speed as the input shaft 102. The first gear 105 is operatively coupled to a second gear 106, such that the teeth of the first gear 105 mesh with the teeth of the second gear 106, which results in the first gear 105 driving the second gear 106 as the input shaft 102 turns.

The second gear 106 is affixed to an intermediate shaft 109 that is internal to the housing 101. The second gear 106 and the intermediate shaft 109 are configured to rotate at the same speed. The intermediate shaft 109 also has a third gear 107 affixed to it, which also rotates at the same speed as the intermediate shaft 109 and the second gear 106.

The third gear 107 is operatively coupled to a fourth gear 108 such that the teeth of the third gear 107 mesh with the teeth of the fourth gear 108, which results in the third gear 107 driving the fourth gear 108 as the intermediate shaft 109 turns.

The gears (105-108) may be affixed to the shafts (101, 102, 109) via splines, keyways, press fits, welding, adhesive, or may be machined with their respective shafts. The gears will have individual characteristics, such as a width, radius, and number of teeth. By adjusting the characteristics of the gears, various reductions in speed and increases in torque can be achieved. For example, if the first gear 105 has fewer teeth than the second gear 106, then the intermediate shaft 109 will have a lower rotational speed as compared to that of the input shaft 102. Further, if the third gear 107 has fewer teeth than the fourth gear 108, then the output shaft 103 will spin at a lower rotational speed as compared to that of both the intermediate shaft 109 and the input shaft 102.

The housing 101 may also contain oil for lubrication and cooling the kinematic components of the gear reducer 100. The oil will have particular characteristics, such as viscosity, temperature rating, etc. The oil will be filed to a defined oil level 110. Seals 112 are located at the openings for the input shaft 102 and the output shaft 103 to seal the interior of the housing.

For the conceptual design of a new gear reducer, a design team may be given a set of engineering requirements, such as torque and power ratings, thermal ratings, speed, overall size envelope, and cost targets. Other special requirements might be given as well; for example, when the end application is for the food processing industry, there may be special requirements for wash-down of the housings or food grade lubricants.

The design team is then tasked with creating different kinematic concepts for a gear reducer that can best satisfy the engineering requirements. A kinematic concept essentially describes the layout of the various shafts and gears (such as the layout of the kinematic components shown in FIG. 1). Then there will be a sizing and analysis process of each kinematic layout. This process determines that the stresses in the shafts and gears stay within acceptable limits and that the bearing lifetime meets the minimum requirements. Embodiments of the present invention automate these concept, sizing, and analysis processes to quickly and efficiently arrive at a gear reducer design that satisfies the supplied engineering requirements. The gear reducer design determined by embodiments of the present invention can then be used to create a real-world gear reducer that satisfies the engineering requirements.

Figure 2:
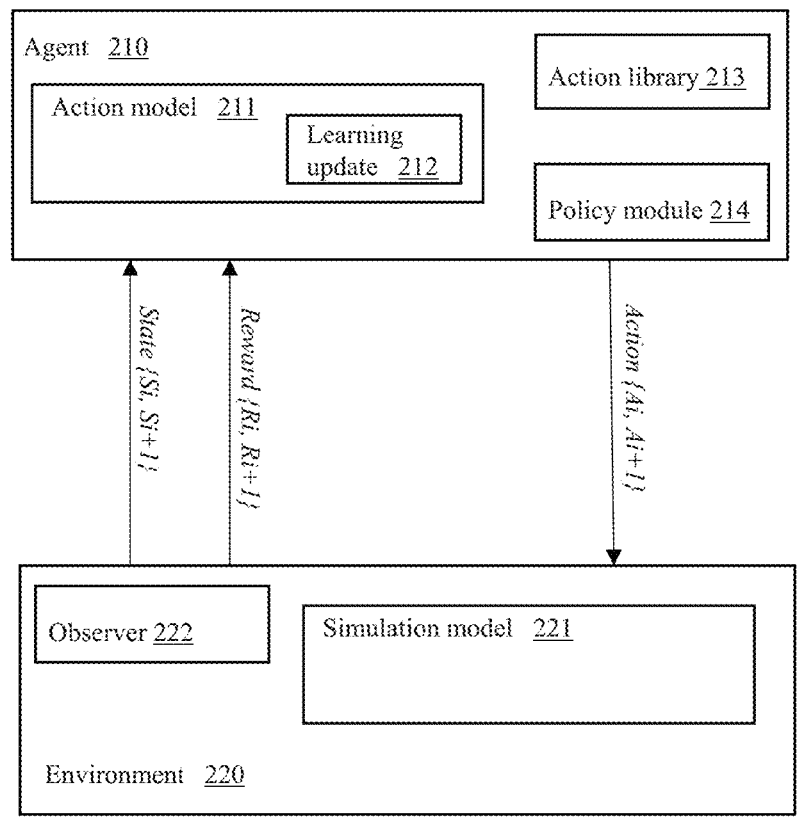
FIG. 2 illustrates a system for automated gearbox design according to an embodiment of the present invention.

FIG. 2 illustrates a block diagram of a reinforcement machine learning system for the automated design of a gear reducer according to an embodiment of the present invention. The reinforcement machine learning system 200 includes an agent 210 and environment 220. The reinforcement machine learning system 200 uses a highly efficient approach to automate the selection (down-selection) of possible design concepts by trading off the many (possibly conflicting) engineering requirements for a gear reducer design concept.

As described above, the agent 210 in a reinforcement machine learning system determines an action $A_i$ to take on a current state $S_i$ of a simulation model 221 in the environment 220 (e.g., a model environment). The current state $S_i$ of the simulation model 221 may correspond to the most recent state received from the environment or correspond to an initial state $S_0$, which represents a starting point of the reducer gear model with initial parameters applied (i.e., the gear reducer model initially instantiated in the modeling environment). The initial parameters (i.e., the initial parameter state) may be an initial best guess for the gear model design solution as determined by the designer based on the engineering requirements.

States of the gear reducer model correspond to states of the relevant design parameters of the gear reducer (i.e., parameter states). For example, different states of the gear reducer model can be represented by possible value combinations of the relevant design parameters. Relevant design parameters include dimensions of components, number of shafts, gears, bearings, etc. as well as material properties, surface hardness, oil viscosity, and tolerance classes. As would be perceived by a person of ordinary skill in the art, the relevant design parameters include at least those parameters that a gear reducer designer would consider in designing a new gear reducer.

The algorithm for determining the action $A_i$ is implemented by the action model 211 of the agent 210. The action model 211 of the present invention is of the reinforcement machine learning model type. In an embodiment, the action model 211 selects a new action $A_i$ from a set of available actions, which may be kept in the action library 213 of the agent 210. While the embodiment illustrated in FIG. 2 includes a single agent 210, other embodiments may have multiple agents with separate, respective action models 211. In an embodiment with multiple agents, the agents may operate in parallel to more quickly converge on a solution.

According to embodiments of the present invention, the actions are actions to change the relevant design parameters of a gear reducer simulation run in the simulation model 221 of the environment 220 (i.e., parameter change actions). Actions stored in the action library 210 can include parameter enlargements and reductions, material substitutions, changes to the number of shafts, bearings and gears used, among others. A person of ordinary skill in the art would understand that the type of actions available would be at least the same as would be available to a human designer changing parameters in a traditional model of a gear reducer.

As shown in the present embodiment, the agent 210 may also include a policy module 214. The policy module 214 may be used to enforce rules for the selection of the actions. These rules can be defined by the gear reducer designer and/or relate to the engineering requirements corresponding to the end application.

The action model 211 may also determine the new action $A_i$ based on a current reward $R_i$ (if present). Rewards correspond to the results of earlier taken actions, and are discussed in more detail below.

In some embodiments, the action model 211 may determine the new action $A_i$ at random or the determination may be influenced (at least in part) by a randomization algorithm. For example, the action model 211 may randomly select one action from a group of actions already determined (e.g., determined based on an available policy, the current state, and the current reward).

After determining the action $A_i$ to apply, the agent 210 sends that action $A_i$ to the environment 220. Upon receiving an action $A_i$, the environment 220 applies the action $A_i$ to the current state $S_i$ of the gear reducer model and determines the updated state $S_{i+1}$ of the gear reducer model. In an embodiment, the simulation model 221 receives the current action $A_i$ and applies it to the current state $S_i$ to determine the next state $S_{i+1}$.

The simulation model 221 also can be used to size, analyze, and/or characterize a gear reducer design model (e.g., a gear reducer design concept as corresponding to a particular set of design parameters, i.e., its parameter state) to determine its performance (i.e., the gear reducer design model performance). The reinforcement machine learning system 200 calculates a reward based on the results of the simulation model 221 (e.g., gives a reward that corresponds to how close the gear reducer design model performance comes to satisfying the engineering requirements or corresponds to the magnitude of the progress made toward satisfying the engineering requirements versus the previous state).

In one embodiment, the simulation model 221 is implemented as including at least one of a KISSsys® model (or other machine element analysis program), a finite element model of a housing, and a cost model.

The KISSsys® model (or other machine element analysis program) models the performance of the kinematic layout (i.e., the assembly of machine components) of the gearbox. For example, the KISSsys® model may take a particular kinematic layout of a gear reducer (e.g., including characteristics and relative relationship of gears, shafts, and bearings), and determines power ratings, bearing life, temperature ratings, speed ratings, weight, torque ratings, etc.

The finite element model is used to size, analyze, and or characterize a static structure of the gear reducer (e.g., the housing, shafts). For example, the finite element model may evaluate stresses, strains, and alignment of components of the gear reducer. ANSYS Mechanical is an example of a finite element modeling software, which may be employed in embodiments.

The cost model may be used to determine a manufacturing cost of the gear reducer. The cost model can, for example, determine a parts list from the KISSsys® model and determine a manufacturing cost from that list. The model can also consider labor costs and bulk build savings.

In an embodiment, the simulation model 221 applies the current actions $A_i$ to change the relevant design parameters of the current KISSsys® model of the gear reducer to determine the updated KISSsys® model, and applies the relevant current actions to $A_i$ to change the relevant design parameters of the housing model to determine the updated housing model. Together, the updated KISSsys® model and the updated housing model correspond to the complete updated state $S_{i+1}$ of the gear reducer model. After this update, the simulation model 221 analyzes and characterizes the updated state $S_{i+1}$ of the gear reducer model, which may include an analysis within the KISSsys® model simulation, the finite element model simulation of the housing, and the costs model.

After the simulation model 221 has updated the state of the gear reducer model $S_{i+1}$ and analyzed and/or characterized the updated state $S_{i+1}$, an reward $R_{i+1}$ is calculated based on those results. In an embodiment, an observer 222 of the environment 220 calculates the updated reward $R_{i+1}$; however, the invention is not so limited, and for example the agent 210 may calculate the updated reward $R_{i+1}$.

The reinforcement machine learning system 200 may calculate the updated reward based on the performance of a particular design as defined by its current state. In embodiments implemented with a KISSsys® model (or the like), a finite element model of a housing, and/or a cost model, the reward function determines rewards based on the simulation results of these models. The reward function may also depend on the given design criteria, such as power or torque densities, manufacturing cost, and efficiency (e.g., operational efficiency, such as having low mechanical losses, including frictional or windage losses). The design criteria can be provided by the gear reducer designer based on the intended application. The value of the reward received can correspond to the magnitude of the progress made toward achieving a gearbox design matching provided engineering requirements.

The observer 222 can also extract and send the updated state $S_{i+1}$ to the agent 210, which can include the results of characterization and analysis assessments as well as the updated design parameters of the updated state $S_{i+1}$.

The agent 210 uses the updated reward $R_{i+1}$ to determine the next action $A_{i+1}$ to apply the updated state $S_{i+1}$ of the gear reducer model. As described above, this determination is made by the action model 211, which may also rely on the defined actions and policies provided by the action library 213 and the policy module 214, respectively. In an embodiment, the action model 211 includes a learning update module 214, which modifies the action model 211 based on the rewards received, including the cumulative rewards received and/or the current reward.

The agent 210 will then send the next action $A_{i+1}$ to the environment 220, and then above-described process will iteratively proceed until a final design of the gear model is determined based on the rewards generated and the design criteria. In some embodiments, the process continues until the performance of the simulated gear reducer design satisfies a performance target. The performance target can be set based on the engineering requirements (e.g., such that the performance satisfies the engineering requirements as best as their conflicts allow).

Once the final model is determined (down-selected) by the reinforcement machine learning system 200, the designer may elect to convert this final model to the production design for the gear reducer or may further analyze and refine the design concept during a subsequent product development phase.

Figure 3:
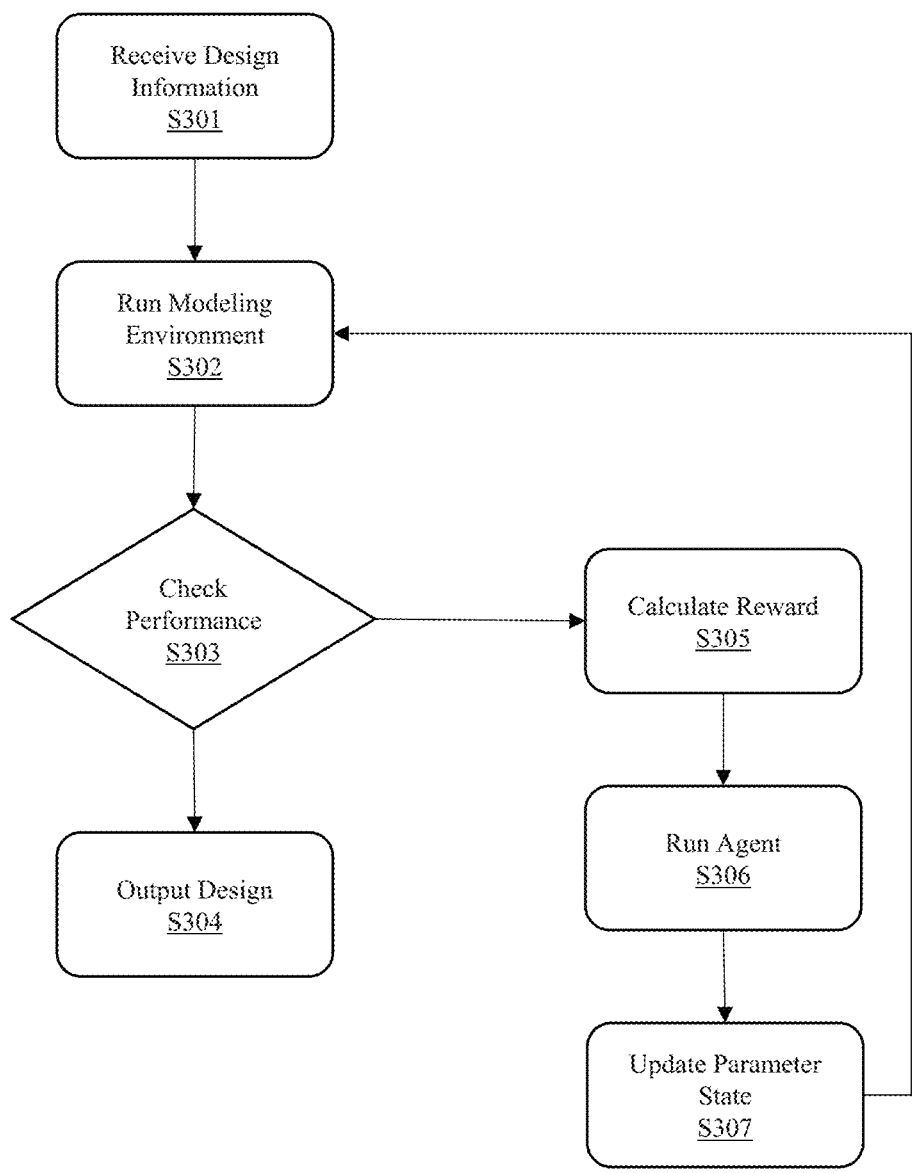
FIG. 3 illustrates a method for automated gearbox design according to an embodiment of the present invention.

FIG. 3 is a flow chart illustrating a method 300 according to an embodiment of the present invention. The method 300 is a reinforcement learning method for automated gear reducer design.

First, a user (e.g., designer) provides gearbox design information (S301). The gearbox design information may include the engineering requirements, such as power rating, reduction ratio, and overall size constraints of the new design. The gearbox design information may also include an initial best guess for the first parameter state of the gear reducer. The initial best guess may be made by the designer, or it may be taken from a look-up table. The first parameter state is used as the initial parameter state of the gear reducer model in the modeling environment.

Next, the performance of the gear reducer model (gearbox performance) with the initial parameter state is determined (S302). The performance calculations are done in the modeling environment (e.g., based on simulations, characterizations, and analysis of the gear reducer model). Many different modeling environments are possible within the scope of the present invention. For example, a modeling environment can be based on standardized engineering equations or on the Finite Element Method (FEM) to find stress levels in the components. One modeling environment that uses standardized engineering equations is available from KISSsys®. An example for a modeling environment that uses the FEM is ANSYS Mechanical. The modeling environment used in the method 300 may use one or both of KISSsys® and ANSYS Mechanical.

The performance calculations may also make use of information beyond the current parameter state in the modeling environment and the engineering conditions. For example, the performance calculations also consider maximum stress levels for the materials used, required safety factors, bearing lifetime requirements, and calculation methods defined by component manufacturers or by applicable industry design standards.

After the gearbox performance is calculated, the method 300 determines whether the gearbox performance of the system with the initial parameter satisfies a performance design target (S303). The performance target typically includes a collection of target metrics, such as a power density target, a torque density target, and/or a cost target; however, other performance targets that need to be met for a certain application are possible as well. The performance target may be generated based on the engineering requirements or may be set by the designer.

If performance target is met, the method 300 ends (S304). Once the method ends, the gear designer can use the final parameter state of the gear reducer model in the environment in the next phase of their design process.

It is likely, however, that the performance of the gear reducer model with the initial parameter state will not satisfy the performance target. In this case, a reward is calculated based on the performance of the system with its current parameter state (S305).

In an embodiment, the reward calculations are done based on a design preference, and are derived from multiple numerical experiments within the modeling environment. The reward calculation process may be tuned through trial and error so that it yields a proper range of rewards. For example, the system is tuned so that a large negative reward is calculated if the selected parameter set does not converge to a feasible design concept, and a positive reward is calculated if the parameter set yields a conceptual design that is physically possible.

After the reward is calculated, an agent (or agents) determines a parameter change action based on the reward (S306). For example actions can be driven by high rewards or avoided by negative rewards. Actions may also be taken (at least in part) at random. By taking random actions (in introducing randomization in the action selection), the agents can explore the parameter space.

The agent of the method 300 is a reinforcement machine learning agent running a reinforcement machine learning algorithm. A reinforcement machine learning algorithm provides that the agent, in response to its reward feedback, goes through several iterations of determining parameter action that ultimately converges to a preferred parameter state that meets the performance target.

The reinforcement machine learning algorithm may also compare the agent's performance to that of an agent that acts optimally (e.g., maximizes future rewards). The difference in performance gives rise to the concept of regret. In order to act near optimally, the agent must reason about the long-term consequences of its actions (i.e., maximize future income), although the immediate reward associated with this might be negative.

In an embodiment, there is a training process used for the agent. During this training process, the agent tries to maximize the future reward by choosing different parameter change actions of the parameter set when it interacts with the modeling environment. After several iterations, the design parameters are learned.

In an embodiment of the present invention, a neural network is used to train the agent; however, not all embodiments require a neural network for the training process of an agent. Generally, embodiments employing a neural network use a complicated and/or hard to parameterize modeling environment, such as using design images as the states, while embodiments without a neural network employ simpler modeling environments, such as an N-D matrix to represent the N parameter states.

The parameter change action determined by the agent is then applied to the current parameter state (S307). This results in the gear reducer model in the modeling environment having an updated parameter state. The method 300 then continues, going through iterations of determining the performance of the current gear reducer model (S302), checking whether that performance satisfies the performance target (S303), calculating a new reward (S305), selecting a new parameter change action (S306), and updating the parameter state (S307) until the method 300 converges to a gear reducer model having a parameter state that satisfies the performance target. By this process, the gear reducer designer can efficiently determine a gear reducer design concept that best meets the relevant design constraints.

Figure 4:
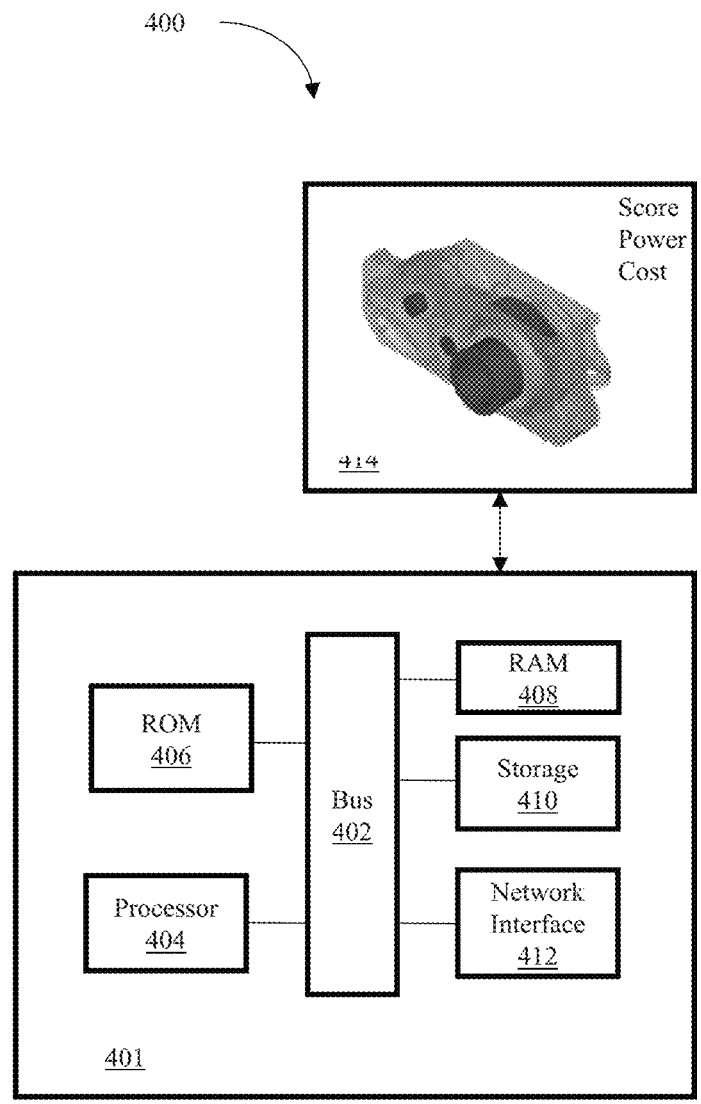
FIG. 4 illustrates a block diagram of a processing system according to an embodiment of the present invention.

FIG. 4 is a block diagram of a gearbox design processing system according to an embodiment. The gearbox design processing system 400 includes a gearbox design computer 401 and a user interface 414.

The gearbox design computer 401 is configured to implement a reinforcement machine learning system performing a reinforcement learning method for automated gearbox design according to embodiments of the present invention. For example, in an exemplary embodiment, an agent (having an action model, action library, and policy module) and an environment (having a simulation model and observer) are instantiated in the gearbox design computer 401. The gearbox design computer 401 includes a processor 404, such as a central processing unit (CPU) of a computing device or a distributed processor system. The processor 404 executes processor executable instructions comprising embodiments of the method and system for performing the functions and methods described above. For example, the instructions may correspond to specialty gearbox design software implementing the systems and methods of the present invention. In embodiments, the processor executable instructions are locally stored or remotely stored and accessed from a non-transitory computer readable medium, such as storage 410, which may be a hard drive, cloud storage, flash drive, etc. Read Only Memory (ROM) 406 includes processor executable instructions for initializing the processor 404, while the random-access memory (RAM) 408 is the main memory for loading and processing instructions executed by the processor 404. The network interface 412 may connect to a wired network or cellular network and to a local area network or wide area network, such as the Internet.

The gearbox design computer 401 is in operational communication with the user interface 414 so that a gearbox designer can interact with the gearbox design computer 401. For example, the user interface may include a display for displaying the gearbox design finally determined by the reinforcement learning method of the present invention, as well as characteristic information (e.g., score, power rating, cost, etc.). The designer can utilize the determined gearbox design (which can include a list of components) to build a corresponding real-world gearbox that satisfies the predefined engineering requirements.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A method for automated gearbox design, the method comprising:
    instantiating a gearbox model having an initial parameter state in a modeling environment;
    analyzing and/or characterizing the gearbox model in the modeling environment to determine gearbox model performance; and
    determining whether the gearbox model performance satisfies a performance target;
    wherein upon a determination that the gearbox model performance does not satisfy the performance target:
        a reward is calculated based on the gearbox model performance;
        a reinforcement machine learning agent determines a parameter change action based on the reward and a current parameter state of the gearbox model; and
        an updated parameter state of the gearbox model is determined based on the parameter change action,
    wherein the parameter change action comprises at least one of enlargements, reductions, material substitutions, or changes to shafts, bearings or gears, or changes to a kinematic layout of the gearbox, and
    wherein the initial parameter state defines at least one of a dimension of a gearbox component a material property, a surface hardness, a tolerance class, a type of gearbox, or a number of shafts, gears or bearings.

2. The method of claim 1, the method further comprising iteratively performing the following operations until the gearbox model performance satisfies the performance target:
    analyzing and/or characterizing the gearbox model having the updated parameter state in the modeling environment to determine the gearbox model performance;
    calculating a new reward based on the gearbox model performance;
    determining, by the reinforcement machine learning agent, a new parameter change action based on the new reward and the updated parameter state of the gearbox model; and
    determining a new updated parameter state of the gearbox model based on the new parameter change action.

3. The method of claim 1, wherein upon a determination that the gearbox model performance satisfies the performance target, outputting the current parameter state of the gearbox model as a final gearbox design.

4. The method of claim 1, wherein the gearbox is a gear reducer.

5. The method of claim 1, wherein the initial parameter state corresponds to an initial gearbox design provided by a user.

6. The method of claim 1, wherein the performance target is based on engineering requirements provided by a user.

7. The method of claim 1, wherein the reinforcement machine learning agent determines the parameter change action based upon a value of the reward.

8. The method of claim 1, wherein the reinforcement machine learning agent determines the parameter change action based on a randomization algorithm.

9. The method of claim 1, wherein the reward is calculated based upon a design criteria corresponding to at least one of a power density, a torque density, a manufacturing cost, or operating efficiency.

10. The method of claim 1, wherein the model environment comprises at least one of a machine element analysis program or a finite element model of a housing.

11. The method of claim 1, wherein the reinforcement machine learning agent is configured to maximize a cumulative reward or to maximize a current reward.

12. The method of claim 1, wherein the model environment comprises a cost model.

13. A system for automated gearbox design, the system comprising:
- a model environment configured to analyze or characterize a gearbox model to determine gearbox model performance, the gearbox model having a parameter state; and
- a reinforcement machine learning agent configured to determine a parameter change action based on a reward and the parameter state of the gearbox model,
- wherein the reward is based upon the gearbox model performance,
- wherein the parameter state of the gearbox model is updateable based on the parameter change action,
- wherein the parameter change action comprises at least one of enlargements, reductions, material substitutions, or changes to shafts, bearings or gears, or changes to a kinematic layout of the gearbox, and
- wherein the model environment has an initial parameter state that defines at least one of a dimension of a gearbox component, a material property, a surface hardness, a tolerance class, a type of gearbox, or a number of shafts, gears or bearings.

14. The system of claim 13,
- wherein the model environment is further configured to update the parameter state of the gearbox model according to the parameter change action, and
- wherein the reinforcement machine learning agent is further configured to iteratively determine a new parameter change action based on a current parameter state of the gearbox and a current reward based on a current gearbox model performance until the current gearbox model performance satisfies a performance target.

15. The system of claim 14, wherein the performance target is based on engineering requirements provided by a user.

16. The system of claim 13, wherein the model environment is configured to set the initial parameter state of the gearbox model based on an input received from a user.

17. The system of claim 13, wherein the model environment comprises at least one of a machine element analysis model, a finite element model of a housing, or a cost model.

18. The system of claim 13, wherein a reinforcement machine learning agent comprises an action library defining available actions used to determine the parameter change action as at least one of enlargements, reductions, material substitutions, or changes to a number of shafts, bearings, or gears.

19. The system of claim 13, wherein the reinforcement machine learning agent is configured to determine the parameter change action based further on a randomization algorithm.

* * * * *